(12) United States Patent
Lin et al.

(10) Patent No.: US 10,804,008 B2
(45) Date of Patent: Oct. 13, 2020

(54) ELECTRICAL COMPONENT

(71) Applicant: LOTES CO., LTD, Keelung (TW)

(72) Inventors: Chin Chi Lin, Keelung (TW); Yu Sheng Chen, Keelung (TW)

(73) Assignee: LOTES CO., LTD, Keelung (TW)

(*) Notice: Subject to any disclaimer, the term of this patent is extended or adjusted under 35 U.S.C. 154(b) by 0 days.

(21) Appl. No.: 16/507,254

(22) Filed: Jul. 10, 2019

(65) Prior Publication Data
US 2020/0082958 A1 Mar. 12, 2020

(30) Foreign Application Priority Data

Sep. 11, 2018 (CN) .......................... 2018 1 1056458
Mar. 11, 2019 (CN) .......................... 2019 1 0180832

(51) Int. Cl.
*H01B 7/08* (2006.01)
*H01B 7/00* (2006.01)
*H05K 1/02* (2006.01)

(52) U.S. Cl.
CPC ......... *H01B 7/0861* (2013.01); *H01B 7/0009* (2013.01); *H01B 7/0838* (2013.01); *H05K 1/028* (2013.01); *H05K 1/0218* (2013.01); *H05K 2201/0723* (2013.01); *H05K 2201/09236* (2013.01)

(58) Field of Classification Search
CPC .. H01B 7/0861; H01B 7/0009; H01B 7/0838; H01B 7/0823; H01B 9/003; H01B 11/08; H01B 7/0876; H01B 11/04; H01B 11/10; H01B 11/00; H01B 11/002; H01B 11/203; H01B 9/02; H05K 1/0218; H05K 1/028;

(Continued)

(56) References Cited

U.S. PATENT DOCUMENTS 3,763,306 A * 10/1973 Marshall .............. H01B 7/0838
174/115
4,468,089 A * 8/1984 Brorein ................ G02B 6/4403
156/53

(Continued)

FOREIGN PATENT DOCUMENTS

CN 2377700 Y 5/2000
CN 102548196 A 7/2012

(Continued)

*Primary Examiner* — Steven T Sawyer
(74) *Attorney, Agent, or Firm* — Locke Lord LLP; Tim Tingkang Xia, Esq.

(57) ABSTRACT

An electrical component includes an insulating base, an insulating layer provided outside the insulating base, a shielding member provided between the insulating base and the insulating layer, and multiple conductive bodies accommodated in the insulating base. The conductive bodies include at least one power supply body. Each of the at least one power supply body is provided with a shielding layer outside the power supply body and an insulator between the power supply body and the shielding layer. The shielding layer is accommodated in the shielding member. In the electrical component, by providing a shielding layer and an insulator provided between the power supply body and the shielding layer outside the power supply body, shielding of the shielding layer from the power supply body is implemented, so as to reduce an interference of the power supply body on a signal body, thereby improving transmission quality of high-frequency signals.

20 Claims, 11 Drawing Sheets

(58) Field of Classification Search
CPC . H05K 2201/0723; H05K 2201/09236; H01R 13/6581; H01R 9/0515; H01R 12/598; H01R 13/5845; H01R 12/53; H04W 4/70; H04W 24/04; H04W 84/18; G08B 25/004; H04L 41/28; H04L 43/0811; H04L 43/0817
USPC .................................. 174/117 F, 102 R, 115
See application file for complete search history.

(56) References Cited

U.S. PATENT DOCUMENTS

| | | | | |
|---|---|---|---|---|
| 5,057,646 | A * | 10/1991 | Nichols | H01B 7/0823 |
| | | | | 174/115 |
| 2012/0267159 | A1* | 10/2012 | Gundel | H01B 7/0861 |
| | | | | 174/350 |
| 2013/0306347 | A1* | 11/2013 | Barbera | H05B 3/56 |
| | | | | 174/103 |
| 2013/0312992 | A1* | 11/2013 | Guetig | H01B 11/203 |
| | | | | 174/34 |
| 2014/0027150 | A1* | 1/2014 | Gundel | H01B 7/08 |
| | | | | 174/102 R |
| 2015/0294760 | A1* | 10/2015 | Gundel | H01B 7/0861 |
| | | | | 174/106 R |

FOREIGN PATENT DOCUMENTS

| | | |
|---|---|---|
| CN | 203118544 U | 8/2013 |
| CN | 206322493 U | 7/2017 |
| CN | 207541969 U | 6/2018 |
| CN | 208352552 U | 1/2019 |

* cited by examiner

ELECTRICAL COMPONENT

CROSS-REFERENCE TO RELATED PATENT APPLICATION

This non-provisional application claims priority to and the benefit of, pursuant to 35 U.S.C. § 119(a), patent application Serial No. CN201811056458.3 filed in China on Sep. 11, 2018 and patent application Serial No. CN201910180832.9 filed in China on Mar. 11, 2019. The disclosures of the above applications are incorporated herein in their entireties by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present invention relates to an electrical component, and in particular to an electrical component for transmitting stable high-frequency signals.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

With the development of electronic technologies, in the transmission process of electrical signals of an electrical component, transmission attenuation of high-frequency signals of a signal conductive body will be affected by a medium and be interfered by an adjacent conductive body. In particular, when the signal conductive body is transmitting the high-frequency signals, the conductive body adjacent to the signal conductive body is a power supply conductive body. In this case, the high-frequency signals may be seriously interfered by the power supply conductive body in the transmission process. The industry often provides a shielding layer around the signal conductive body for transmitting the high-frequency signals to isolate the interference from other conductive bodies.

However, in the general electrical components, a quantity of signal conductive bodies is much greater than that of power supply conductive bodies, such that the quantity of shielding layers provided outside the signal conductive bodies is greater. Consequently, the corresponding cost is increased, and an improvement to the signal interference thereof is very limited.

Therefore, a heretofore unaddressed need to design an improved electrical component exists in the art to address the aforementioned deficiencies and inadequacies.

SUMMARY

The present invention is directed to an electrical component with better high-frequency signal transmission.

In order to achieve the foregoing objective, the present invention adopts the following technical solutions:

An electrical component includes: an insulating base; an insulating layer provided outside the insulating base; a shielding member provided between the insulating base and the insulating layer; and a plurality of conductive bodies accommodated in the insulating base and comprising at least one power supply body; wherein each of the at least one power supply body is provided with a shielding layer outside the power supply body and an insulator between the power supply body and the shielding layer, and the shielding layer is accommodated in the shielding member.

In certain embodiments, the shielding layer is in contact with the shielding member.

In certain embodiments, each of the at least one power supply body is cylindrical shaped, and other ones of the conductive bodies are flat shaped.

In certain embodiments, the insulator is provided outside the power supply body and is tubular shaped, and the shielding layer is provided outside the insulator and is tubular shaped.

In certain embodiments, the shielding member comprises an upper shielding member provided above the insulating base and a lower shielding member provided below the insulating base, and the insulating layer comprises an upper insulating layer provided above the upper shielding member and a lower insulating layer provided below the lower shielding member.

In certain embodiments, the insulator protrudes upward and downward from the insulating base.

In certain embodiments, the conductive bodies are arranged side by side in a transverse direction, and further comprises a plurality of power supply bodies, a plurality of signal bodies and a plurality of grounding bodies, and the conductive bodies are arranged in sequence as: one of the grounding bodies, two of the signal bodies, one of the power supply bodies, four of the signal bodies, one of the power supply bodies, two of the signal bodies, and one of the grounding bodies.

In certain embodiments, the conductive bodies further comprise a grounding body provided adjacent to one of the at least one power supply body, and a pair of signal bodies provided between the grounding body and the adjacent one of the at least one power supply body, configured to transmit differential signals.

In certain embodiments, the electrical component is a flexible circuit board.

An electrical component includes: an insulating base; a shielding member provided outside the insulating base; an insulating layer provided outside the shielding member; a plurality of conductive bodies accommodated in the insulating base and comprising a power supply body, a grounding body, and a pair of signal bodies provided between the power supply body and the grounding body and configured to transmit differential signals, wherein the grounding body is electrically connected to the shielding member; an insulator provided outside the power supply body; and a shielding layer provided outside the insulator and electrically connected to the shielding layer.

In certain embodiments, the shielding layer and the grounding body are in contact with the shielding member.

In certain embodiments, the insulator wraps outside the power supply body and is tubular shaped, and the shielding layer wraps outside the insulator and is tubular shaped.

In certain embodiments, the insulating base comprises an upper insulating base and a lower insulating base opposite to each other, the upper insulating base is protrudingly provided with a plurality of protruding blocks, each of the protruding blocks corresponds to a corresponding one of the signal bodies, each of the protruding blocks downward abuts a middle portion of the corresponding one of the signal bodies, the lower insulating base is protrudingly provided with a plurality of protrusions, and two adjacent ones of the protrusions upward abut two opposite sides of a same one of the signal bodies.

In certain embodiments, each of the protusions is upward protrudingly provided with a protruding portion, and the protruding portion is located between two adjacent ones of the conductive bodies and upward abuts the upper insulating base.

In certain embodiments, the lower insulating base is provided with a plurality of slots between each of the two adjacent ones of the protrusions, each of the protruding blocks is located right above a corresponding one of the slots, and a width of each of the protruding blocks in a transverse direction is less than a width of each of the slots in the transverse direction.

In certain embodiments, a protruding length of each of the protruding blocks in a vertical direction is equal to a depth of each of the slots in the vertical direction and is greater than a thickness of each of the signal bodies in the vertical direction.

In certain embodiments, the conductive bodies are arranged side by side in a transverse direction, and the grounding body extends in the transverse direction to pass beyond the insulating base and abuts the shielding member.

In certain embodiments, the insulating layer comprises a first portion and a second portion, the first portion covers the insulating base in a vertical direction, the second portion covers a contact region of the grounding body and the shielding member in the vertical direction, and a size of the first portion in the vertical direction is greater than a size of the second portion in the vertical direction.

In certain embodiments, the insulating base comprises an upper insulating base and a lower insulating base separately formed, the upper insulating base and the lower insulating base are pressed against each other to fix the signal bodies and the grounding body, the shielding member comprises an upper shielding member and a lower shielding member separately formed, the upper shielding member is provided above the upper insulating base and is insert-molded with the upper insulating base, the lower shielding member is provided below the lower insulating base and is insert-molded with the lower insulating base, the upper shielding member downward abuts the grounding body, and the lower shielding member upward abuts the grounding body.

In certain embodiments, the power supply body is cylindrical shaped, and the signal bodies and the grounding body are flat shaped.

Compared with the related art, the electrical component according to certain embodiments of the present invention have the following beneficial effects:

In the electrical component, by providing a shielding layer and an insulator provided between the power supply body and the shielding layer outside the power supply body, shielding of the shielding layer from the power supply body is implemented, so as to reduce an interference of the power supply body on a signal body, thereby improving transmission quality of high-frequency signals. Further, the grounding body and the shielding layer are electrically connected to the shielding member, thereby forming a shielding space wrapping outside the signal bodies constituting a differential pair, so as to separate the signal bodies from outside environment, such that the interference to signal transmission of the signal bodies is reduced, and the signal quality thereof is better.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

Figure 1:
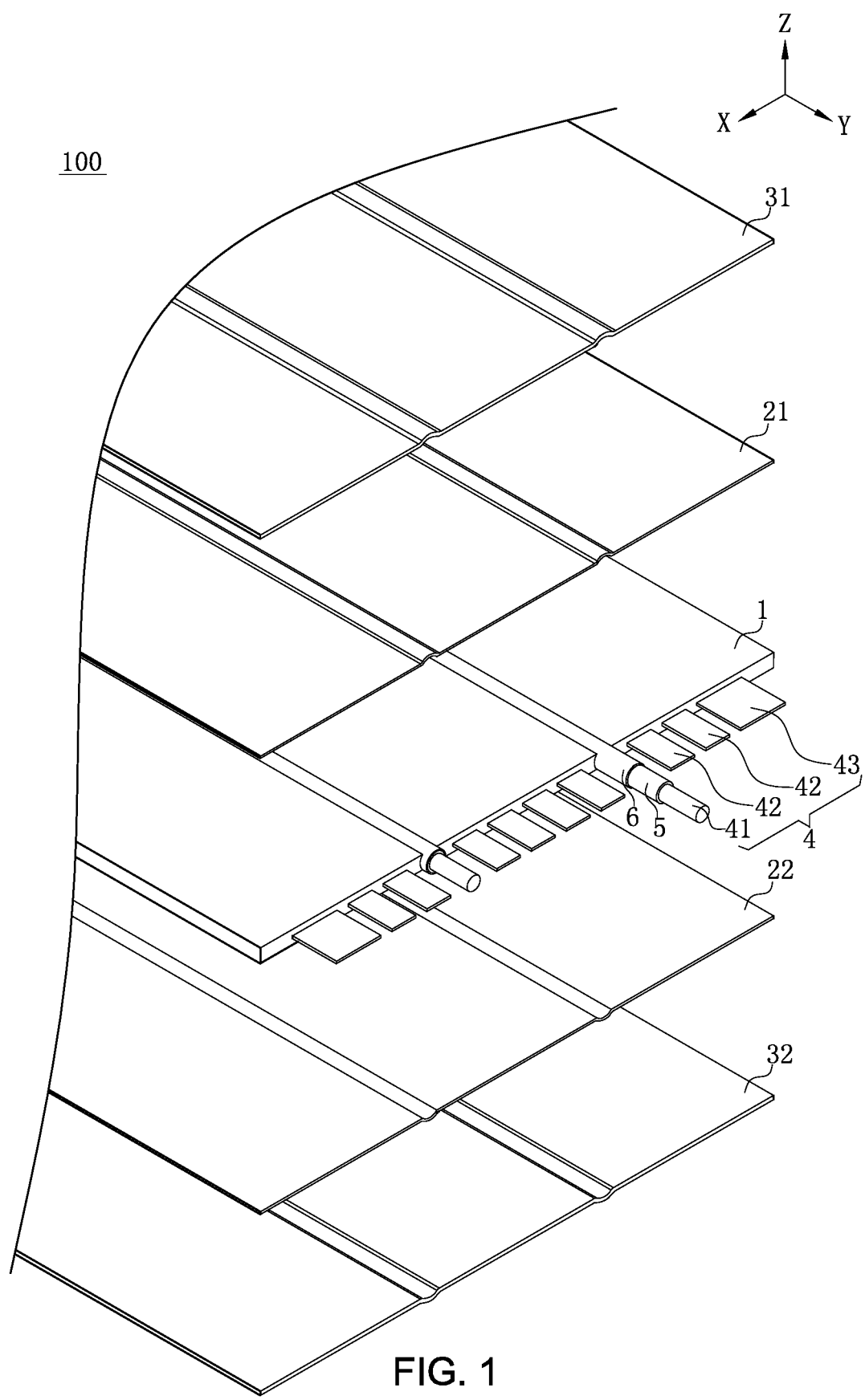
FIG. 1 is a perspective exploded view of an electrical component according to a first embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-11. In accordance with the purposes of this invention, as embodied and broadly described herein, this invention, in one aspect, relates to an electrical component.

As shown in FIG. 1 to FIG. 11, an electrical component 100 according to certain embodiments of the present invention is a flexible circuit board, and the electrical component 100 can be electrically connected to another mating member (not shown). In other embodiments, the electrical component 100 may be a hard circuit board, or may be a cable structure, and certainly may be a connector type structure.

Figure 2:
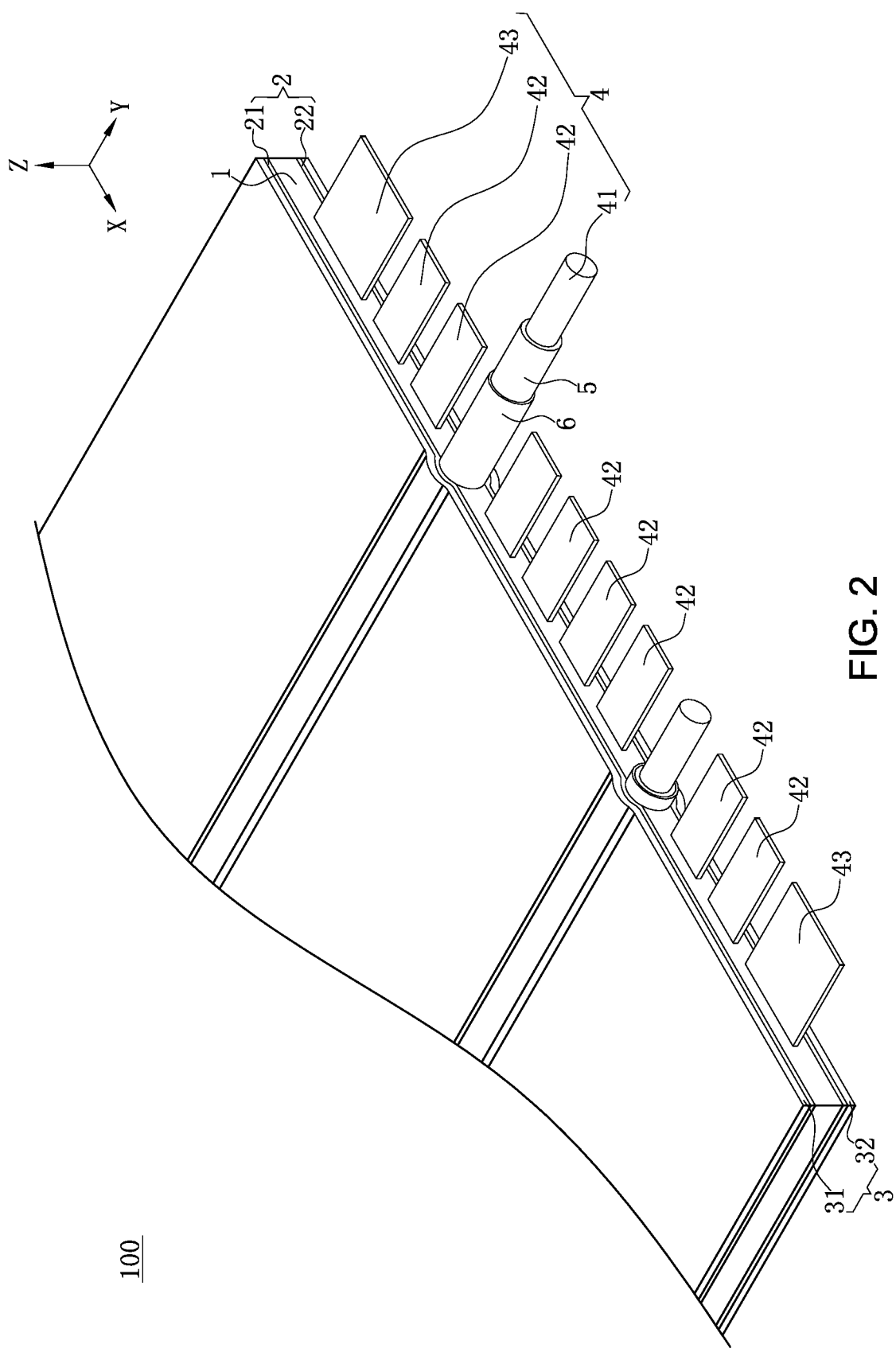
FIG. 2 is a schematic perspective assembled view of FIG. 1.
Figure 3:
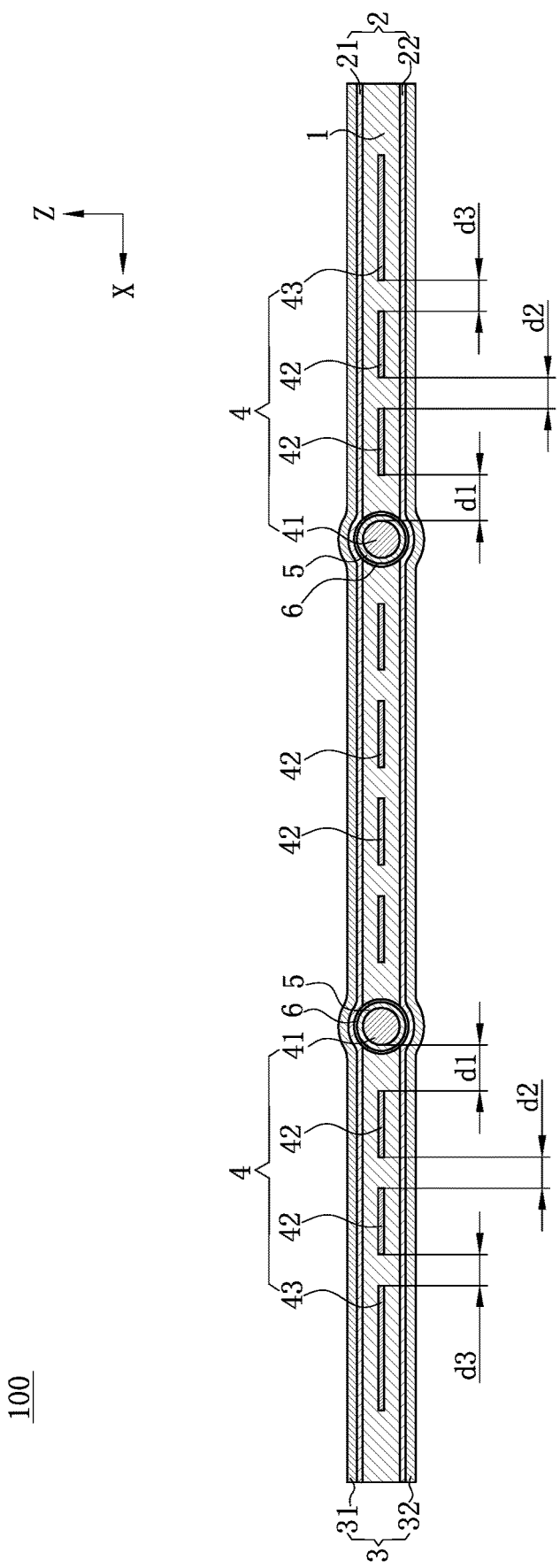
FIG. 3 is a sectional view of FIG. 2.

FIG. 1 to FIG. 3 show the electrical component 100 according to a first embodiment of the present invention. First, an X-axis direction is defined as a transverse direction, a Y-axis direction is defined as a longitudinal direction, and a Z-axis direction is defined as a vertical direction. The electrical component 100 is substantially a flexible circuit board having a five-layer structure, which includes an insulating base 1. The insulating base 1 extends along the Y-axis direction to substantially form a cuboid shaped. The insulating base 1 can also be in other possible shapes in other embodiments, such as a cube shape. A shielding member 2 is provided outside the insulating base 1.

The shielding member 2 includes an upper shielding member 21 provided above the insulating base 1 and a lower shielding member 22 provided below the insulating base 1. An insulating layer 3 is provided outside the shielding member 2. The insulating layer 3 includes an upper insulating layer 31 provided above the upper shielding member 21 and a lower insulating layer 32 provided below the lower shielding member 22.

As shown in FIG. 2 and FIG. 3, multiple conductive bodies 4 are accommodated in the insulating base 1. The conductive bodies 4 include a plurality of power supply bodies 41, a plurality of signal bodies 42 and a plurality of grounding bodies 43. Twelve (12) conductive bodies 4 are provided and are arranged in a single row in the X-axis direction, and are arranged in sequence as: a grounding body 43, two signal bodies 42, a power supply body 41, four signal bodies 42, a power supply body 41, two signal bodies 42, and a grounding body 43. Each of the two signal bodies 42 between the power supply body 41 and the grounding body 43 are used for transmitting differential signals. The grounding bodies 43 and the signal bodies 42 are all flat shaped, and a width of each of the grounding bodies 43 in the X-axis direction is greater than a width of each of the signal bodies 42 in the X-axis direction. A thickness of each of the grounding bodies 43 in the Z-axis direction is equal to a thickness of each of the signal bodies 42 in the Z-axis direction. A length of each of the grounding bodies 43 in the Y-axis direction is equal to a length of each of the signal bodies 42 in the Y-axis direction. Therefore, a volume of each of the grounding bodies 43 is greater than a volume of each of the signal bodies 42. Each of the power supply bodies 41 is cylindrical shaped, and a diameter of each of the power supply bodies 41 is equal to a thickness of the insulating base 1 in the Z-axis direction. That is, the highest point and the lowest point of each of the power supply bodies 41 in the Z-axis direction respectively correspond to an upper surface and a lower surface of the insulating base 1, the highest point and the upper surface are on a same horizontal plane, and the lowest point and the lower surface are on a same horizontal plane. An insulator 5 is provided outside each of the power supply bodies 41 and is tubular shaped, and the insulator 5 protrudes out of the upper surface and the lower surface of the insulating base 1. A shielding layer 6 is provided outside the insulator 5 and is tubular shaped. The shielding layer 6 is in contact with the upper shielding member 21 and the lower shielding member 22 respectively in the Z-axis direction. The insulator 5 protrudes from the upper surface and the lower surface of the insulating base 1, the shielding layer 6 is provided outside the insulator 5, the shielding member 2 is provided on the upper surface and the lower surface of the insulating base 1, and the insulating layer 3 is provided on an upper surface and a lower surface of the shielding member 2. Therefore, the shielding member 2 and the insulating layer 3 appear to protrude outward at a position corresponding to each of the power supply bodies 41.

As shown in FIG. 3, a distance d1 between each power supply body 41 and an adjacent signal body 42 is greater than a distance d2 between two adjacent signal bodies 42. The distance d1 between each power supply body 41 and the adjacent signal body 42 is greater than a distance d3 between each grounding body 43 and an adjacent signal body 42. The distance d2 between the two adjacent signal bodies 42 is equal to the distance d3 between each grounding body 43 and the adjacent signal body 42. That is, in this embodiment, the distance d1 between each power supply body 41 and the adjacent signal body 42 is greater than the distance d2 between the two adjacent signal bodies 42, and is also greater than the distance d3 between each signal body 42 and the adjacent grounding body 43. This is because each power supply body 41 is cylindrical, and the diameter of each power supply body 41 is much less than the width of each signal body 42 or each grounding body 43 in the X-axis direction, such that a distance between a cylindrical body and a flat body is increased. In other embodiments, the conductive body 4 adjacent to each power supply body 41 may also be a grounding body 43 or a power supply body 41, which depends on practical applications of the electrical component 100 and can be planned and arranged autonomously.

Figure 4:
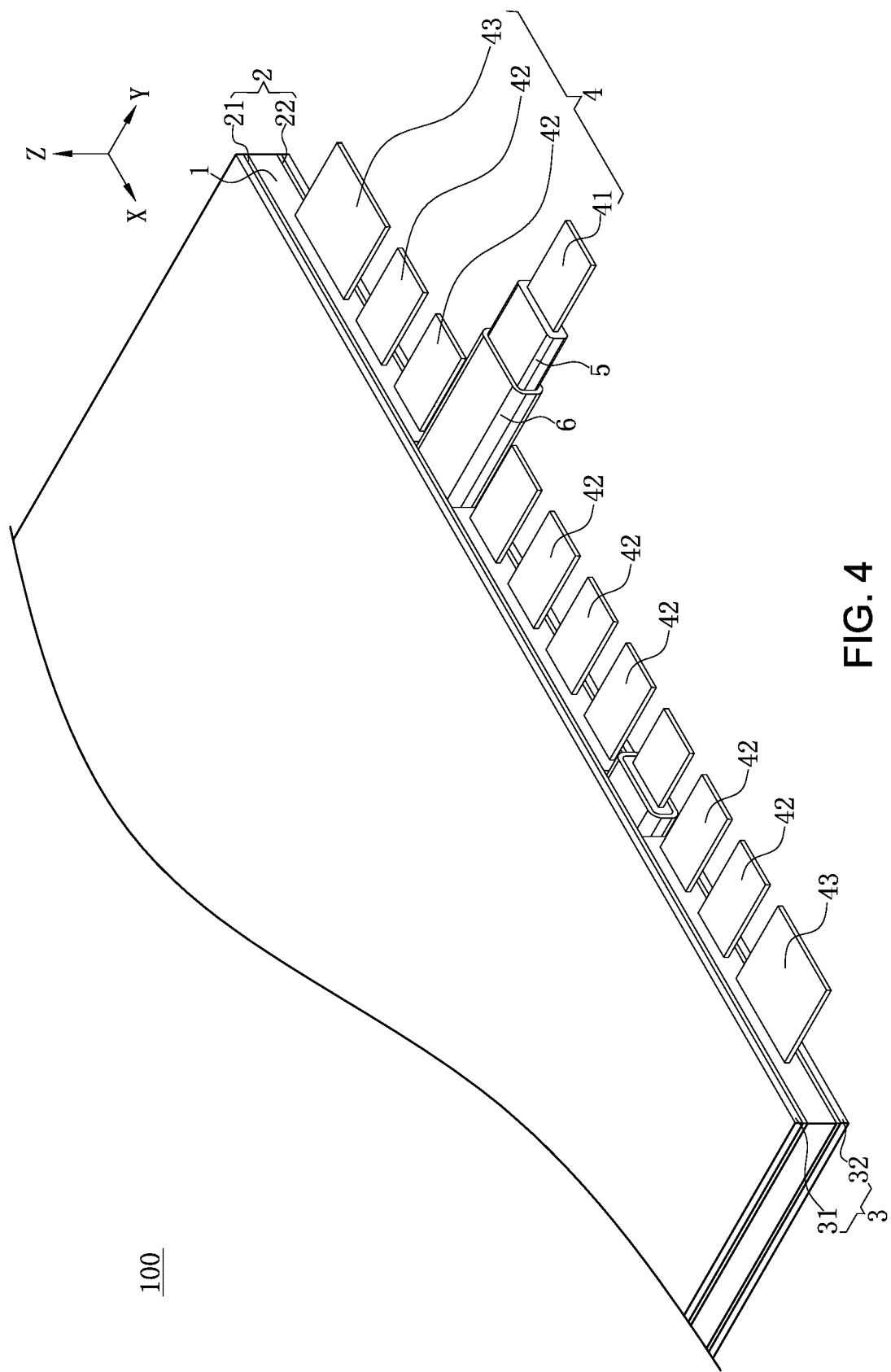
FIG. 4 is a perspective schematic view of an electrical component according to a second embodiment of the present invention.
Figure 5:
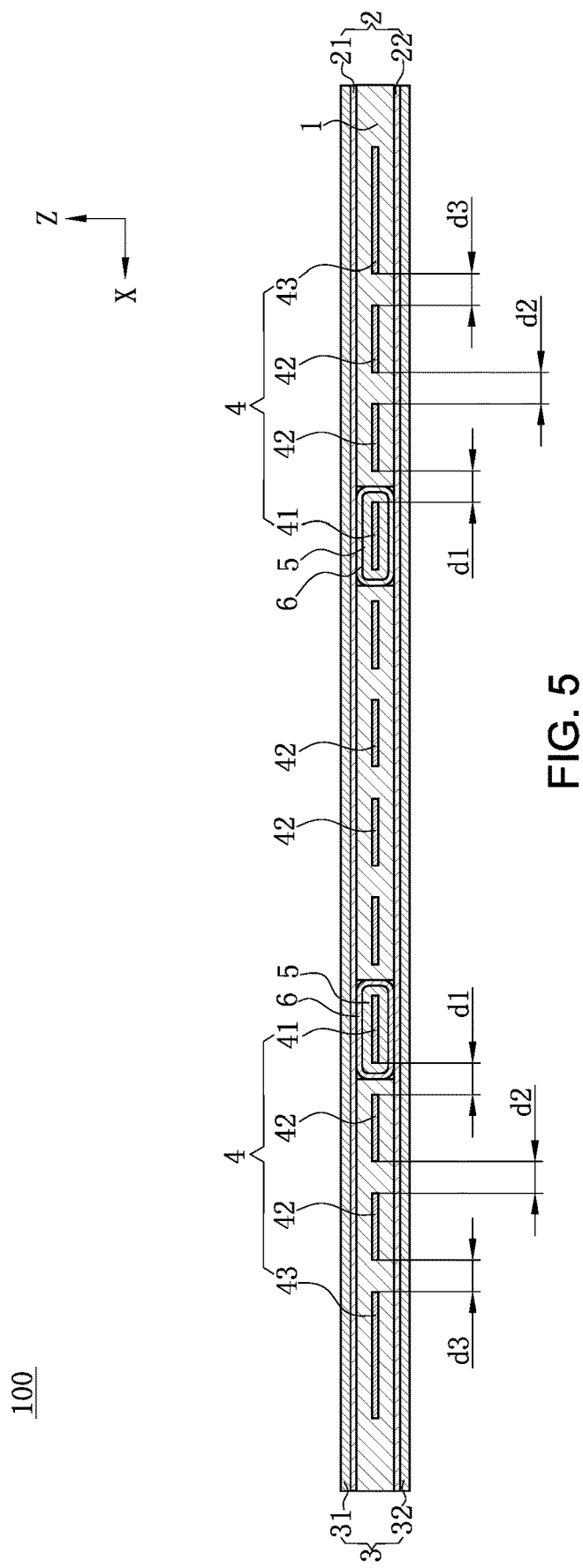
FIG. 5 is a sectional view of FIG. 4.

FIG. 4 and FIG. 5 show an electrical component 100 according to a second embodiment of the present invention, which is different from the first embodiment in that: the structures of the power supply bodies 41, the signal bodies 42 and the grounding bodies 43 are all flat, the insulator 5 provided outside each power supply body 41 is substantially rectangular frame shaped, and the shielding layer 6 provided outside the insulator 5 is also substantially rectangular frame shaped. Neither the insulator 5 nor the shielding layer 6 protrudes out of an upper surface and a lower surface of the insulating base 1. Therefore, an upper surface and a lower surface of the shielding member 2 and an upper surface and a lower surface of the insulating layer 3 are all flat. A distance between each power supply body 41 and an adjacent signal body 42 is d1, a distance between two adjacent signal bodies 42 is d2, and a distance between each grounding body 43 and the adjacent signal body 42 is d3. The distance d1, the distance d2, and the distance d3 are all equal.

Figure 6:
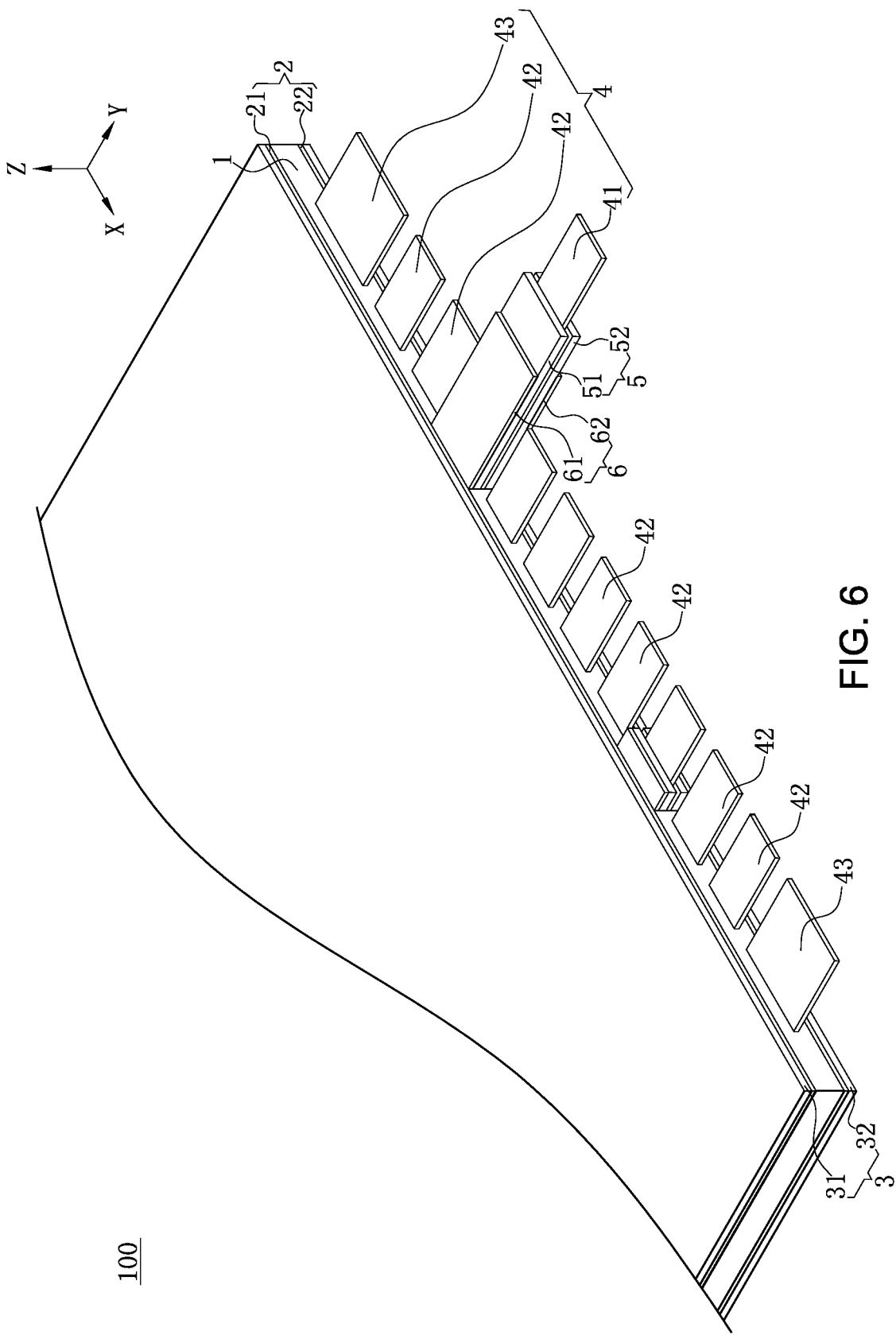
FIG. 6 is a perspective schematic view of an electrical component according to a third embodiment of the present invention.
Figure 7:
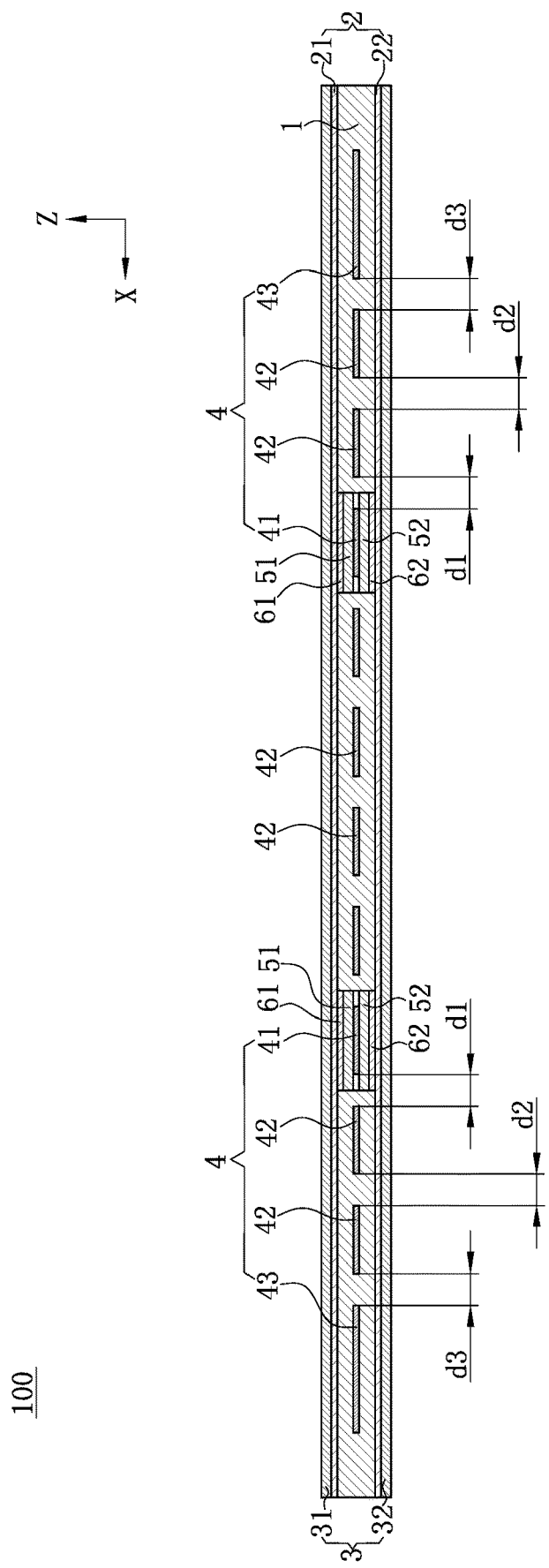
FIG. 7 is a sectional view of FIG. 6.

FIG. 6 and FIG. 7 show an electrical component 100 according to a third embodiment of the present invention, which is different from the first embodiment in that: the structures of the power supply bodies 41, the signal bodies 42 and the grounding bodies 43 are all flat, a distance between each power supply body 41 and an adjacent signal body 42 is d1, a distance between two adjacent signal bodies 42 is d2, and a distance between each grounding body 43 and the adjacent signal body 42 is d3. The distance d1, the distance d2, and the distance d3 are all equal. The insulator 5 includes an upper insulator 51 provided above the corresponding power supply body 41 and a lower insulator 52 provided below the corresponding power supply body 41. The shielding layer 6 includes an upper shielding layer 61 provided above the upper insulator 51 and a lower shielding layer 62 provided below the lower insulator 52. Since the structures of the power supply bodies 41, the signal bodies 42 and the grounding bodies 43 are all flat, and the shielding layer 6 does not protrude from an upper surface and a lower surface of the insulating base 1, an upper surface and a lower surface of the shielding member 2 and an upper surface and a lower surface of the insulating layer 3 are flat. A width of each power supply body 41 in an X-axis direction is less than a width of the insulator 5 and a width of the shielding layer 6 in the X-axis direction. A width of the shielding layer 6 in the X-axis direction is equal to the width of the insulator 5 in the X-axis direction. A thickness of the shielding layer 6 in a Z-axis direction is less than a thickness of the insulator 5 in the Z-axis direction.

FIG. 8 to FIG. 11 show the electrical component 100 according to a fourth embodiment of the present invention, in which multiple conductive bodies 4 are accommodated in the insulating base 1, and the quantity and arrangement of the conductive bodies 4 are identical to those in the first embodiments. That is, the conductive bodies 4 are arranged in a single row in the X-axis direction, and are arranged in sequence as: a grounding body 43, two signal bodies 42, a power supply body 41, four signal bodies 42, a power supply body 41, two signal bodies 42, and a grounding body 43. Each of the two signal bodies 42 between the power supply body 41 and the grounding body 43 are used for transmitting differential signals.

Figure 9:
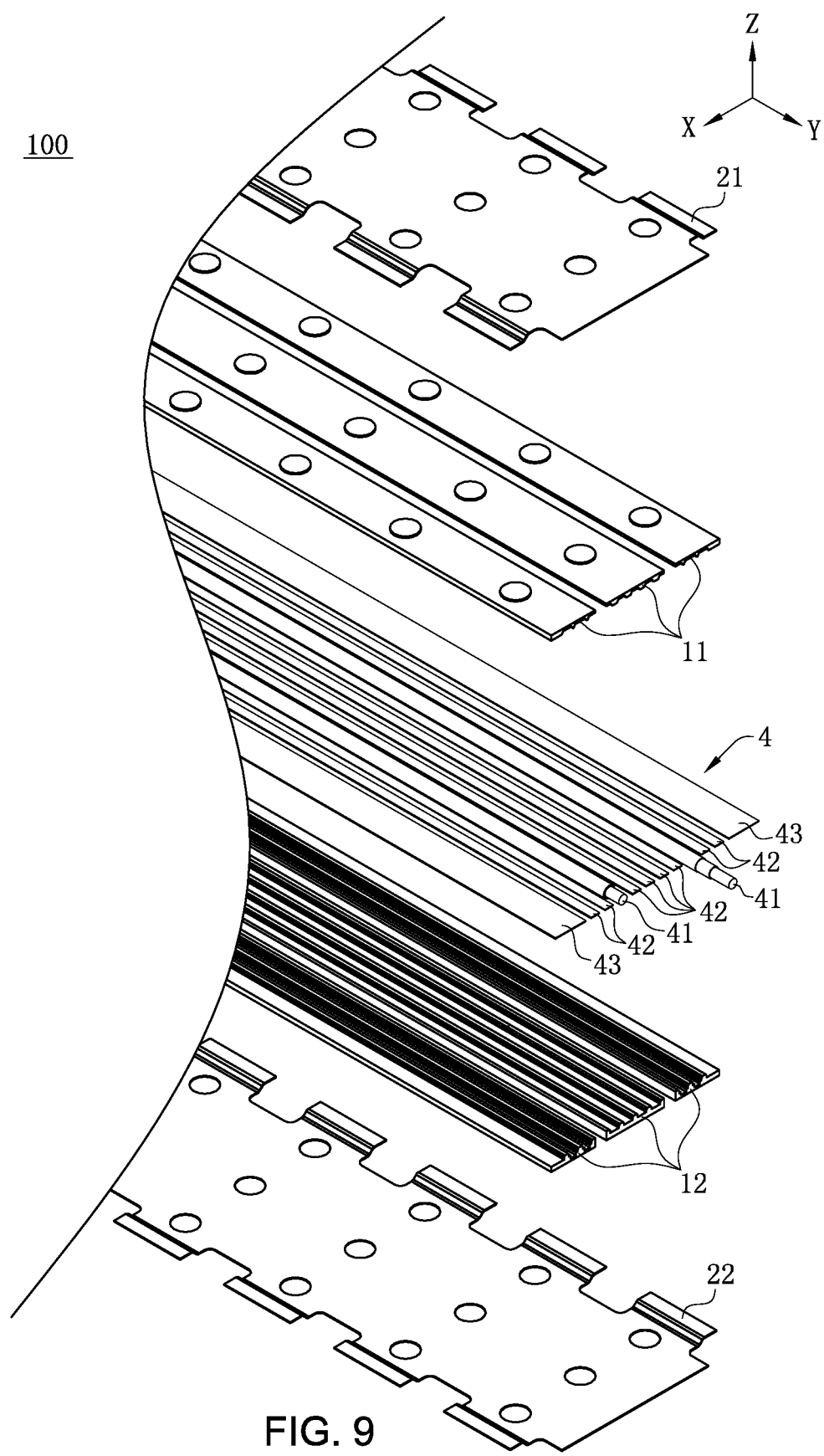
FIG. 9 is a perspective exploded view of the electrical component in FIG. 8 with the insulating layer being removed.
Figure 11:
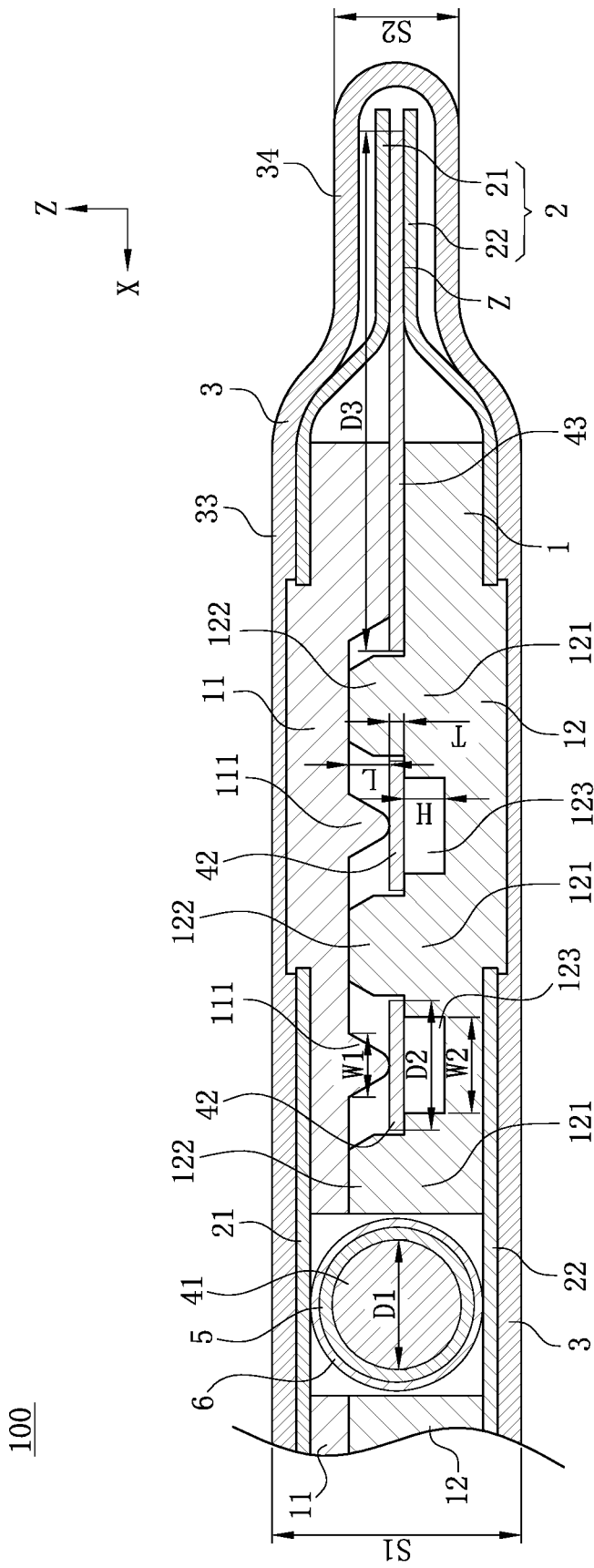
FIG. 11 is a partial enlarged view of FIG. 10.

As shown in FIG. 9 and FIG. 11, the insulating base 1 includes an upper insulating base 11 and a lower insulating base 12 separately formed, and the upper insulating base 11 and the lower insulating base 12 are pressed against each other to fix the signal bodies 42 and the grounding bodies 43.

As shown in FIG. 11, the upper insulating base 11 is protrudingly provided and formed with a plurality of protruding blocks 111, and each of the protruding blocks 111 corresponds to each of the signal bodies 42 forming the differential pair. Each of the protruding blocks 111 downward abuts a middle portion of the corresponding signal body 42. A width of each of the protruding blocks 111 in its extending direction is gradually reduced, and a tail end of each of the protruding blocks 111 is curve shaped. As shown in FIG. 11, the lower insulating base 12 is upward protrudingly provided with a plurality of protrusions 121, and each of the protrusions 121 is upward protrudingly provided with a protruding portion 122. Two adjacent ones of the protrusions 122 upward abut two opposite sides of one of the signal bodies 42 forming the differential pair. The protruding portion 122 is located between two adjacent ones of the conductive bodies 4 and upward abuts the upper insulating base 11. The lower insulating base 12 is provided with a plurality of slots 123, and each slot 123 is located between two adjacent ones of the protrusions 121. Each of the protruding blocks 111 is located right above a corresponding one of the slots 123. A width W1 of each of the protruding blocks 111 in the X-axis direction is less than a width W2 of each of the slots 123 in the X-axis direction. A protruding length L of each of the protruding blocks 111 in the Z-axis direction is equal to a depth H of each of the slots 123 in the Z-axis direction and is greater than a thickness T of the corresponding signal body 42 in the Z-axis direction.

As shown in FIG. 9 and FIG. 11, the shielding member 2 includes an upper shielding member 21 and a lower shielding member 22 separately formed. The upper shielding member 21 is provided above the upper insulating base 11 and is insert-molded with the upper insulating base 11. The lower shielding member 22 is provided below the lower insulating base 12 and is insert-molded with the lower insulating base 12.

Figure 8:
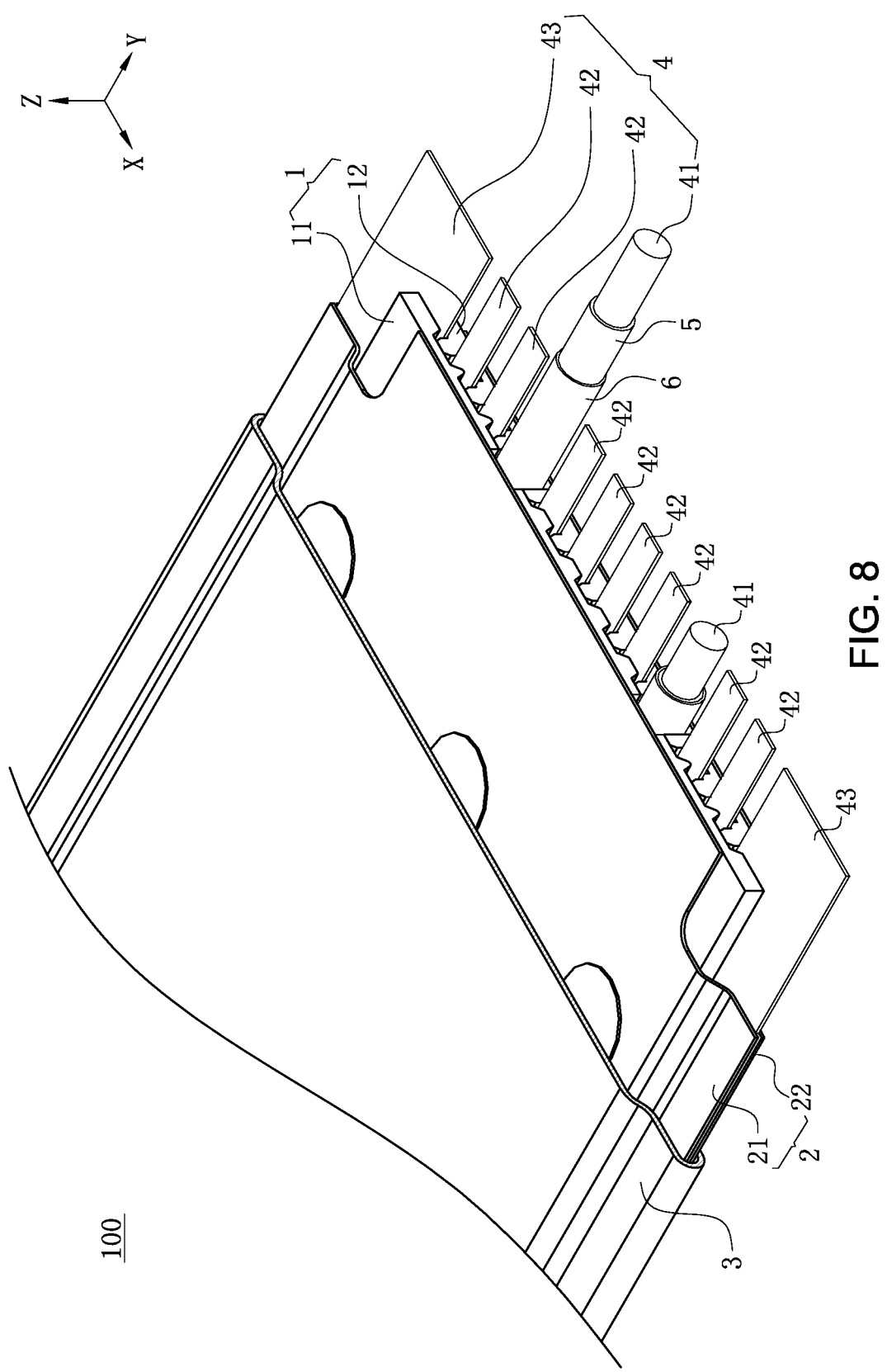
FIG. 8 is a perspective assembled schematic view of an electrical component according to a fourth embodiment of the present invention.
Figure 10:
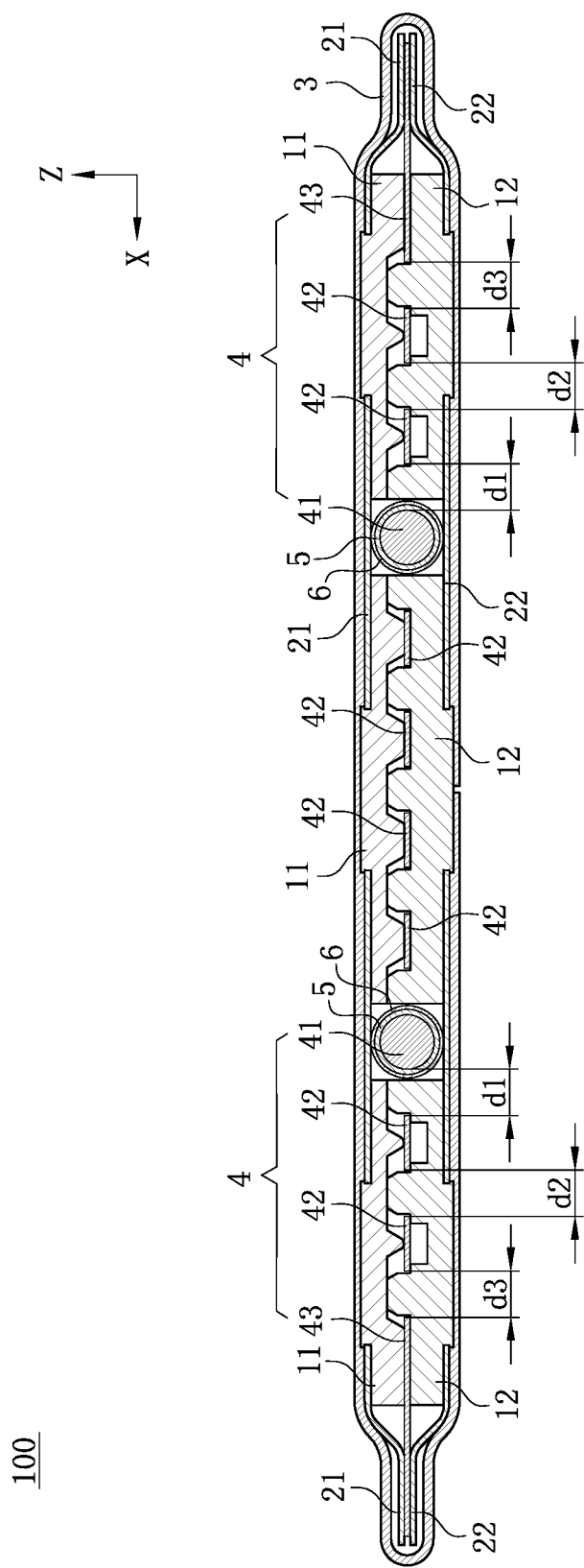
FIG. 10 is a sectional view of FIG. 8.

As shown in FIG. 8 and FIG. 10, the insulating layer 3 is an integral structure, and wraps outside the upper shielding member 21 and the lower shielding member 22.

As shown in FIG. 9 and FIG. 11, the power supply body 41 is cylindrical shaped, and the signal bodies 42 and the grounding body 43 are flat shaped. A diameter D1 of each power supply body 41 is equal to a width D2 of each signal body 42 in the X-axis direction, and is less than a width D3 of the grounding body 43 in the X-axis direction. A distance between the power supply body 41 and an adjacent signal body 42 is d1, a distance between the two signal bodies 42 forming the differential pair is d2, and a distance between the grounding body and an adjacent signal body 42 is d3, where the distance d1, the distance d2 and the distance d3 are all equal.

As shown in FIG. 9 and FIG. 11, the insulator 5 wraps outside the power supply body 41 and is tubular shaped, and the shielding layer 6 wraps outside the insulator 5 and is tubular shaped. The shielding layer 6 respectfully abuts the upper shielding member 21 and the lower shielding member 22.

As shown in FIG. 8, FIG. 9 and FIG. 11, the grounding body 43 passes beyond the upper insulating base 11 and the lower insulating base 12 in the X-axis direction. The upper shielding member 21 bends downward and extends toward the grounding body 43, and the lower shielding member 22 bends upward and extends toward the grounding body 43. The upper shielding member 21 and the lower shielding member 22 respectively abut the grounding body 43 so as to form a contact region Z. The insulating layer 3 includes a first portion 33 and a second portion 34. The first portion 33 covers the upper insulating base 11 and the lower insulating base 12 in the Z-axis direction, and the second portion 34 covers the contact region Z in the Z-axis direction. A size S1 of the first portion 33 in the Z-axis direction is greater than a size S2 of the second portion 34 in the Z-axis direction.

To sum up, the electrical component according to certain embodiments of the present invention has the following beneficial effects:

(1) In certain embodiments of the present invention, by providing a shielding layer 6 and an insulator 5 provided between the power supply body 41 and the shielding layer 6 outside the power supply body 41, shielding of the shielding layer 6 from the power supply body 41 is implemented, so as to reduce an interference of the power supply body 41 on a signal body 42, thereby improving transmission quality of high-frequency signals. Further, compared with providing the shielding structure outside the signal bodies 42 in the related art, by providing the shielding layer 6 outside the power supply body 41, production costs of the insulator 5 and the shielding layer 6 are greatly reduced.

(2) The grounding body 43 and the shielding layer 6 are respectively in contact with the upper shielding member 21 and the lower shielding member 22, thereby forming a shielding space wrapping outside the signal bodies 42 constituting a differential pair, so as to separate the signal bodies 42 from outside environment, such that the interference to signal transmission of the signal bodies 42 is reduced, and the signal quality thereof is better.

(3) By conductively connecting the shielding layer 6 and the shielding member 2, complete separation of the power supply body 41 from the signal bodies 42 on both left and right sides can be implemented, such that signal transmission interference of the signal bodies 42 is reduced and the signal quality thereof is better.

(4) By providing a shielding layer 6 and an insulator 5 provided between the power supply body 41 and the shielding layer 6 outside the power supply body 41, the insulator 5 completely wraps the power supply body 41, and the shielding layer 6 completely wraps the insulator 5, the interference of the power supply body 41 on the signal bodies 42 is reduced in a great extent, and the signal transmission quality thereof is improved.

(5) The power supply body 41 is cylindrical shaped, and the diameter of the power supply body 41 is much less than the width of the signal body 42 or the grounding body 43 in the X-axis direction, such that the distance d1 between the cylindrical power supply body 41 and the flat signal body 42 is increased, thereby reducing the interference of the power supply body 41 on the signal bodies 42 and improving the transmission quality of the high-frequency signals.

(6) Each of the protruding blocks 111 downward abuts a middle portion of the corresponding signal body 42. Two adjacent ones of the protrusions 122 upward abut two opposite sides of the corresponding one of the signal bodies 42. Each slot 123 is located right below a corresponding protruding block 111, and each slot 123 is larger than the corresponding protruding block 111, such that the signal bodies 42 can be fixed to the insulating base 1 through very small portions, ensuring that a large portion of each signal body 42 is in contact with air and transmits signals through the air. Compared to the conventional electrical component 100 transmits signals through plastic portions, the structure has a super low signal attenuation effect.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical component, comprising:
an insulating base;
a shielding member provided outside the insulating base;
an insulating layer provided outside the shielding member;
a plurality of conductive bodies accommodated in the insulating base and comprising a power supply body, a grounding body, and a pair of signal bodies provided between the power supply body and the grounding body and configured to transmit differential signals, wherein the grounding body is electrically connected to the shielding member;
an insulator provided outside the power supply body; and
a shielding layer provided outside the insulator and electrically connected to the shielding member,
wherein the insulating base comprises an upper insulating base and a lower insulating base opposite to each other, the upper insulating base is protrudingly provided with a plurality of protruding blocks, each of the protruding blocks corresponds to a corresponding one of the signal bodies, each of the protruding blocks downward abuts a middle portion of the corresponding one of the signal bodies, the lower insulating base is protrudingly provided with a plurality of protrusions, and two adjacent ones of the protrusions upward abut two opposite sides of a same one of the signal bodies.

2. The electrical component according to claim 1, wherein the shielding layer and the grounding body are in contact with the shielding member.

3. The electrical component according to claim 1, wherein the insulator wraps outside the power supply body and is tubular shaped, and the shielding layer wraps outside the insulator and is tubular shaped.

4. The electrical component according to claim 1, wherein each of the protrusions is upward protrudingly provided with a protruding portion, and the protruding portion is located between two adjacent ones of the conductive bodies and upward abuts the upper insulating base.

5. The electrical component according to claim 1, wherein the lower insulating base is provided with a plurality of slots between each of the two adjacent ones of the protrusions, each of the protruding blocks is located right above a corresponding one of the slots, and a width of each of the protruding blocks in a transverse direction is less than a width of each of the slots in the transverse direction.

6. The electrical component according to claim 5, wherein a protruding length of each of the protruding blocks in a vertical direction is equal to a depth of each of the slots in the vertical direction and is greater than a thickness of each of the signal bodies in the vertical direction.

7. An electrical component, comprising:
an insulating base;
a shielding member provided outside the insulating base;
an insulating layer provided outside the shielding member;

a plurality of conductive bodies accommodated in the insulating base and comprising a power supply body, a grounding body, and a pair of signal bodies provided between the power supply body and the grounding body and configured to transmit differential signals, wherein the grounding body is electrically connected to the shielding member;

an insulator provided outside the power supply body; and a shielding layer provided outside the insulator and electrically connected to the shielding member, wherein the conductive bodies are arranged side by side in a transverse direction, and the grounding body extends in the transverse direction to pass beyond the insulating base and abuts the shielding member.

8. The electrical component according to claim 7, wherein the insulating layer comprises a first portion and a second portion, the first portion covers the insulating base in a vertical direction, the second portion covers a contact region of the grounding body and the shielding member in the vertical direction, and a size of the first portion in the vertical direction is greater than a size of the second portion in the vertical direction.

9. An electrical component, comprising:

an insulating base;

a shielding member provided outside the insulating base;

an insulating layer provided outside the shielding member;

a plurality of conductive bodies accommodated in the insulating base and comprising a power supply body, a grounding body, and a pair of signal bodies provided between the power supply body and the grounding body and configured to transmit differential signals, wherein the grounding body is electrically connected to the shielding member;

an insulator provided outside the power supply body; and a shielding layer provided outside the insulator and electrically connected to the shielding member, wherein the insulating base comprises an upper insulating base and a lower insulating base separately formed, the upper insulating base and the lower insulating base are pressed against each other to fix the signal bodies and the grounding body, the shielding member comprises an upper shielding member and a lower shielding member separately formed, the upper shielding member is provided above the upper insulating base and is insert-molded with the upper insulating base, the lower shielding member is provided below the lower insulating base and is insert-molded with the lower insulating base, the upper shielding member downward abuts the grounding body, and the lower shielding member upward abuts the grounding body.

10. The electrical component according to claim 1, wherein the power supply body is cylindrical shaped, and the signal bodies and the grounding body are flat shaped.

11. The electrical component according to claim 1, wherein the grounding body abuts the shielding member, the insulating layer comprises a first portion and a second portion, the first portion covers the insulating base in a vertical direction, the second portion covers a contact region of the grounding body and the shielding member in the vertical direction, and a size of the first portion in the vertical direction is greater than a size of the second portion in the vertical direction.

12. The electrical component according to claim 1, wherein the electrical component is a flexible circuit board.

13. The electrical component according to claim 7, wherein the shielding layer and the grounding body are in contact with the shielding member.

14. The electrical component according to claim 7, wherein the insulator wraps outside the power supply body and is tubular shaped, and the shielding layer wraps outside the insulator and is tubular shaped.

15. The electrical component according to claim 7, wherein the power supply body is cylindrical shaped, and the signal bodies and the grounding body are flat shaped.

16. The electrical component according to claim 7, wherein the electrical component is a flexible circuit board.

17. The electrical component according to claim 9, wherein the insulator wraps outside the power supply body and is tubular shaped, and the shielding layer wraps outside the insulator and is tubular shaped.

18. The electrical component according to claim 7, wherein the power supply body is cylindrical shaped, and the signal bodies and the grounding body are flat shaped.

19. The electrical component according to claim 9, wherein the grounding body abuts the shielding member, the insulating layer comprises a first portion and a second portion, the first portion covers the insulating base in a vertical direction, the second portion covers a contact region of the grounding body and the shielding member in the vertical direction, and a size of the first portion in the vertical direction is greater than a size of the second portion in the vertical direction.

20. The electrical component according to claim 9, wherein the electrical component is a flexible circuit board.

* * * * *